United States Patent [19]
Fleischmann et al.

[11] Patent Number: 5,319,326
[45] Date of Patent: Jun. 7, 1994

[54] SURFACE-WAVE-TYPE REFLECTIVE DELAY LINE

[75] Inventors: Bernd Fleischmann; Peter Zibis, both of Munich, Fed. Rep. of Germany

[73] Assignee: Siemens Matsushita Comp. GmbH & Co KG, Munich, Fed. Rep. of Germany

[21] Appl. No.: 865,348

[22] Filed: Apr. 8, 1992

[30] Foreign Application Priority Data

Apr. 11, 1991 [DE] Fed. Rep. of Germany ....... 4111867

[51] Int. Cl.⁵ .............................................. H03H 9/42
[52] U.S. Cl. .................................... 333/150; 333/196; 333/154; 333/153
[58] Field of Search ............... 333/150, 151, 152, 153, 333/154, 193, 196, 194, 195; 310/313 R, 313 B, 313 C, 313 D; 364/821; 375/90

[56] References Cited

U.S. PATENT DOCUMENTS

| | | | |
|---|---|---|---|
| 4,609,891 | 9/1986 | Solie et al. | 333/195 |
| 4,656,601 | 4/1987 | Merritt et al. | 333/193 |
| 4,933,588 | 6/1990 | Greer | 333/194 |
| 4,947,073 | 8/1990 | Stokes et al. | 310/313 R |
| 4,950,935 | 8/1990 | Furukawa | 310/313 R |
| 5,033,063 | 7/1991 | Okamoto et al. | 375/90 |
| 5,043,620 | 8/1991 | Mitsutsuka | 333/153 |
| 5,056,055 | 10/1991 | Shinonaga | 364/821 |
| 5,073,763 | 12/1991 | Wright | 333/193 |
| 5,128,640 | 7/1992 | Anemogiannis | 333/193 |
| 5,130,681 | 7/1992 | Ohnuki et al. | 333/196 |
| 5,162,689 | 11/1992 | Fliegel et al. | 310/313 B |
| 5,175,519 | 12/1992 | Yatsuda et al. | 333/194 |

FOREIGN PATENT DOCUMENTS 1468047 3/1977 United Kingdom ................ 333/154

OTHER PUBLICATIONS

G. Riha, H. R. Stocket, R. Veith, W. E. Bulst, RAC—Filters with position weighted metallic strip arrays, 1982, IEEE ultrasonic symposium pp. 83–87.

Primary Examiner—Raymond A. Nelli
Attorney, Agent, or Firm—Herbert L. Lerner; Laurence A. Greenberg

[57] ABSTRACT

A surface-wave-type reflective delay line includes an input/output interdigital converter, and a plurality of surface wave reflectors. The surface wave reflectors are disposed at positions corresponding to an order of magnitude of half of a particular desired transit time of a surface wave between the input/output interdigital converter and an applicable surface wave reflector and back. At least some of the surface wave reflectors are each shifted by a mathematically random value out of the positions corresponding to half the particular desired transit time.

3 Claims, 1 Drawing Sheet

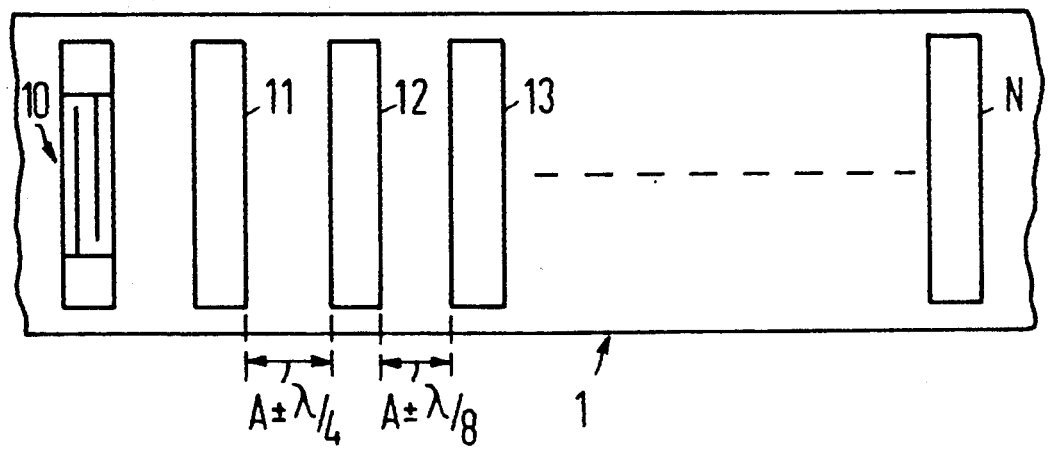

SURFACE-WAVE-TYPE REFLECTIVE DELAY LINE

The present invention relates to a reflective delay line, in surface wave technology or of a surface-wave-type, having an input/output interdigital converter and a plurality of surface wave reflectors, which for the particular desired transit time of the surface wave between the input/output interdigital converter and the applicable surface wave reflector and back, are disposed at positions that correspond to the order of magnitude of half the particular desired transit time.

Such a delay line serves to store a high-frequency signal introduced through the input/output interdigital converter, and at certain times to reflect a predetermined constant portion of the stored energy to the input/output interdigital converter. The purpose thereof is, for instance, to convert the introduced high-frequency signal into a bit code for recognition purposes. A surface wave corresponding to the introduced high-frequency signal and being generated by the input/output interdigital converter is reflected at reflectors located at various intervals or "positions" of the input/output interdigital converter, and after the applicable transit time, which is predetermined by the spacing of the particular reflector, it arrives at the input/output interdigital converter again, where it is reconverted into a corresponding electrical pulse.

In order to make a bit code, the configuration may be provided in such a way that mutually similar reflector structures are provided on the delay line that are either reflecting or non-reflecting, so that a reflecting reflector structure can correspond to a first logic level, and a non-reflecting reflector structure can correspond to a second logic level.

The term "reflector structure" is used herein, in contradistinction to the term "reflector", because it may be technologically suitable to first provide generally identical structures on the delay line, which are then selectively converted into reflecting or non-reflecting structures by certain process technology provisions, the details of which are of no particular interest in this case. This process is also known as "setting" the reflectors. In other words, the bits of the predetermined code are "set" in the delay line. A "reflecting reflector structure" would then correspond to the above-selected term "reflector", as far as terminology is concerned.

Previously, the reflectors have been disposed at positions on the delay line that each correspond to half the desired transit time of the surface wave between input/output interdigital converters and the applicable surface wave reflectors. However, since not only reflections occur in the delay line, in the sense that a surface wave transmitted by the input/output interdigital converter is reflected at a reflector and returns from it to the input/output interdigital converter, but surface wave components are also reflected between the reflectors, multiple reflections arise, which are superimposed on one another in phase, or in other words additively, if the aforementioned condition is met that the positions of the surface wave reflectors are each equivalent to half the desired transit time and the time intervals of adjacent bits are always of equal magnitude. This additive superimposition of the surface wave components produced by multiple reflections can cause interference, so that as a result the predetermined bit code may no longer be correctly recognized at the input/output interdigital converter.

It is accordingly an object of the invention to provide a surface-wave-type reflective delay line, which overcomes the hereinafore-mentioned disadvantages of the heretofore-known devices of this general type and which maximally reduces interference from multiple reflections if it does not eliminate it entirely, or in other words, which keeps the proportion of energy of the surface wave to be reflected as constant as possible, to the greatest degree possible, for the various times defined by the positions of the reflectors.

With the foregoing and other objects in view there is provided, in accordance with the invention, a surface-wave-type reflective delay line, comprising an input/output interdigital converter, and a plurality of surface wave reflectors, said surface wave reflectors being disposed at positions corresponding to an order of magnitude of half of a particular desired transit time of a surface wave between said input/output interdigital converter and an applicable surface wave reflector and back, and at least some of said surface wave reflectors each being shifted by a mathematically random value out of the positions corresponding to half the particular desired transit time.

In accordance with another feature of the invention, the mathematically random value of said shift of said surface wave reflectors is between $-\lambda/4$ and $+\lambda/4$, where $\lambda$ represents the acoustical wavelength of the surface waves.

In accordance with a concomitant feature of the invention, the surface wave reflectors are reflecting and non-reflecting reflector structures for attaining a predetermined bit code in an output pulse train at said input/output interdigital converter, said reflecting reflector structures correspond to a first logic level and said non-reflecting reflector structures correspond to a second logic level, and every other reflecting reflector structure is shifted by $\lambda/4$ or $\lambda/8$ out of the position corresponding to the particular desired half transit time toward or away from said input/output interdigital converter, where $\lambda$ represents the acoustical wavelength of the surface waves.

Other features which are considered as characteristic for the invention are set forth in the appended claims.

Although the invention is illustrated and described herein as embodied in a surface-wave-type reflective delay line, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a fragmentary, diagrammatic, elevational view of an exemplary embodiment of a reflective delay line.

Referring now to the single FIGURE of the drawing in detail, there is seen a known reflective delay line having a single input/output interdigital converter 10 provided on a piezoelectric substrate 1. An electrical high-frequency input is introduced into the input/output interdigital converter 10 and converted into an acoustic surface wave. The surface wave is propagated along the piezoelectric substrate and strikes surface wave reflectors 11, 12, 13, . . . , N, from which it is reflected back to the input/output interdigital converter 10 and the various reflected components of the surface wave are reconverted into pulse-like electrical signals. The surface wave reflectors may be known elements, for instance they may likewise be interdigital structures.

As noted initially above, an interfering in-phase (additive) superimposition of multiple reflections would arise if all of the surface wave reflectors 11 to N were to be spaced apart by equal distances, represented by a symbol A. In order to avoid this, according to the invention at least some of the surface wave reflectors 11 to N are each shifted, by a mathematically random value, from the positions corresponding to the particular desired transit time of the surface wave between the input/output interdigital converter 10 and the applicable reflector. As a result of this shift, the multiple reflections are no longer all superimposed in phase (additively). Instead, a destructive interference arises, which at least reduces the total amplitude of the multiple reflections.

Preferably, the shift is selected to be a mathematically random value between $-\lambda/4$ and $+\lambda/4$. As a result, the multiple reflections are no longer superimposed in phase, and there is an additional advantage which is that the temporal position in the bit code is only altered slightly. This subject matter is indicated in the drawing by way of example by indicating a distance A $\pm\lambda/4$ between the surface wave reflectors 11 and 12. Lambda in this case stands for the acoustical wavelength of the surface wave at the mean frequency of the delay line.

Particularly advantageous conditions pertain if there is a positional shift of every other "set" surface wave reflector by $\lambda/4$ toward or away from the input/output interdigital converter 10. The term "setting" of a surface wave reflector is again understood in the light of the subject matter already discussed above, in other words that identical, for instance non-reflecting, reflector structures are first made on the delay line, and of them, in a further step, only some certain reflector structures are made reflective, or in other words are set.

With the indicated positional shift by $\pm\lambda/4$, it is true for triple reflections that half of these triple reflections have a phase position of 0° and the other half have a phase position of 180°, relative to the single reflections of non-shifted reflectors. The degree of destructive interference of the triple reflections is also dependent on the distribution of the set bit positions and on the individual intensity of the reflections.

The particularly advantageous conditions discussed above are also attained if instead of the aforementioned positional shift of every other set reflector by $\lambda/4$, a shift by $\lambda/8$ is performed. In that case, the result is triple reflections having the phase positions of 0°, +90°, −90° and 180°. These phase positions occur unequally often, so that although the destructive interference is restricted, nevertheless an advantage is attained which is that some of the multiple reflections are in phase quadrature with the single reflections, and therefore have less of an effect upon their amplitude as compared with the aforementioned displacement by $\lambda/4$.

We claim:

1. A surface-wave-type reflective delay line, comprising:
  a piezoelectric substrate,
  an input/output interdigital converter disposed on said substrate, and
  a plurality of surface wave reflectors disposed on said substrate,
  said surface wave reflectors disposed at nominal positions each having a distance from said input/output interdigital converter equal to a multiple of a half wavelength of an acoustic wave on said substrate, wherein said multiple is a positive integer, and
  at least one of said surface wave reflectors is shifted a shift distance equal to a random value from the nominal positions, wherein said random value of said shift distance of said surface wave reflectors is between $-\lambda/4$ and $+\lambda/4$, wherein $\lambda$ represents the acoustical wavelength of the surface waves.

2. The delay line according to claim 1, wherein:
  said surface wave reflectors include reflecting and non-reflecting reflector structures for attaining a predetermined bit code in an output pulse train at said input/output interdigital converter,
  said reflecting reflector structures correspond to a first logic level and said non-reflecting reflector structures correspond to a second logic level, and
  every other reflecting reflector structure is shifted by $\lambda/4$ from the position corresponding to the respective half transit time toward or away from said input/output interdigital converter.

3. The delay line according to claim 1, wherein:
  said surface wave reflectors include reflecting and non-reflecting reflector structures for attaining a predetermined bit code in an output pulse train at said input/output interdigital converter,
  said reflecting reflector structures correspond to a first logic level and said non-reflecting reflector structures correspond to a second logic level, and
  every other reflecting reflector structure is shifted by $\lambda/8$ away from the nominal position corresponding to the respective half wavelength toward or away from said input/output interdigital converter.

* * * * *